United States Patent [19]

Brand et al.

[11] Patent Number: 5,160,762
[45] Date of Patent: Nov. 3, 1992

[54] METHOD OF MANUFACTURING MONO-LAYER CAPACITORS

[75] Inventors: Hans-Wolfgang Brand, Aachen; Mareike K. Klee, Hückelhoven/Brachelen, both of Fed. Rep. of Germany; Johan W. C. De Vries, Eindhoven, Netherlands; Rainer M. Waser, Aachen, Fed. Rep. of Germany; Robertus A. M. Wolters, Eindhoven, Netherlands

[73] Assignee: U.S. Philips Corporation, New York, N.Y.

[21] Appl. No.: 706,822

[22] Filed: May 29, 1991

[30] Foreign Application Priority Data

May 31, 1990 [DE] Fed. Rep. of Germany ....... 4017518

[51] Int. Cl.$^5$ ............................................. B05D 5/12
[52] U.S. Cl. ................................... 427/79; 427/126.2; 427/126.3; 427/226; 427/240; 427/435; 427/443.2; 427/399; 427/404; 427/419.2; 427/419.3; 437/235
[58] Field of Search ...................... 427/79, 226, 126.3, 427/126.2, 399, 240, 443.2, 435, 404, 419.2, 419.3; 437/235

[56] References Cited

U.S. PATENT DOCUMENTS

| | | | |
|---|---|---|---|
| 4,485,094 | 11/1984 | Pebler et al. | 427/126.3 |
| 4,584,280 | 4/1986 | Nango et al. | 427/388.2 |
| 4,704,299 | 11/1987 | Wielonski et al. | 427/327.7 |
| 4,963,390 | 10/1990 | Lipeles | 427/110 |
| 5,006,363 | 4/1991 | Fujii et al. | 427/39 |

Primary Examiner—Janyce Bell
Attorney, Agent, or Firm—Robert J. Kraus

[57] ABSTRACT

A method of manufacturing monolayer capacitors having a ferroelectric layer on the basis of titanium as a dielectric on a substrate, the ferroelectric layer being located between a first and a second noble metal electrode, in which the ferroelectric layer is formed as a barium titanate layer having a layer thickness in the range of from 0.2 to 0.6 μm in that a stable solution of salts of carbonic acids, alkoxides and/or acetyl acetonates is applied and is thermally decomposed at temperatures in the range of from 500° to 700° C., the solution constituting the ferroelectric layer being adjusted so that after the thermal decomposition process an excess quantity of titanium oxide of about 1 mol. % is obtained, and this coating process being repeated until the desired layer thickness is attained, after which the second noble metal electrode is provided on the ferroelectric layer.

11 Claims, No Drawings

METHOD OF MANUFACTURING MONO-LAYER CAPACITORS

BACKGROUND OF THE INVENTION

The invention relates to a method of manufacturing mono-layer capacitors having a ferroelectric layer on the basis of titanate as a dielectric on a substrate, the ferroelectric layer being located between a first and a second electrode of noble metal.

Ferroelectric ceramic material containing as main constituent, for example, $BaTiO_3$ is used as a dielectric of capacitors on account of its high dielectric constant.

Capacitors comprising ferroelectric materials, such as, for example, $BaTiO_3$, require for a plurality of applications a low dependence of the capacitance upon the temperature. By way of example, capacitors having an X7R-characteristic are mentioned, in which $\Delta C/C$ (25° C.)= ±15% lies in the range of from −55° C. and +125° C. For this purpose, specific dopants, such as, for example, Nb and Co, must be introduced into the barium titanate. Such capacitors are manufactured nowadays in a multi-step process, $BaTiO_3$ powder having the desired doping being mixed with a binder and being pulled out to foils. These foils are alternately stacked between electrodes, which consist of Pd, Pd/Ag alloys or Ni on account of the high sintering temperature of the ceramic material of $BaTiO_3$. The stacked foils are sintered at a temperature of 1300° C. After this process, multi-layer capacitors are manufactured, in which the thicknesses of the ceramic dielectric lie between 15 and 30 $\mu m$ and which due to the stacking of up to 50 ceramic layers having surface areas of 1 to 7 $mm^2$ have capacitances of up to 500 nF. This means that each ceramic layer has a sheet capacitance of 2 to 3 $nF/mm^2$. In order to obtain in this known process capacitors having high capacitances, the grain size of the ceramic material of $BaTiO_3$ must be adjusted optimally. With a grain size of $\approx 0.7$ $\mu m$ it is possible to obtain ceramic materials of $BaTiO_3$ having a dielectric constant $\epsilon$ of 3000 to 4000. With such a grain size of the ceramic material, comparatively high insulation resistances are obtained in the ceramic layers having layer thicknesses of 15 to 30 $\mu m$; with 15 $\mu m$ thick Nb/Co-doped ceramic layers of $BaTiO_3$ insulation resistances of $10^9$ to $10^{10}$ Ohm.m were measured at 5 V/$\mu m$ and 20° C.

In view of the miniaturization of electronic components, it is desirable to increase the volume capacitance of capacitors. This can be attained by reduction of the thickness of the dielectric layers. Further, the direct integration of a capacitor into integrated circuits comprising silicon single crystal wafers is desirable because this would lead to a substantial reduction of the cost for the installation of the components and to an improvement of the electrical properties due to the line inductances and line capacitances connected to the supply conductors becoming superfluous. This is of particular advantage with the use of the components in electronic computers.

The main obstacle in reducing the dielectric layer thickness d to values below 15 $\mu m$ is the strong decrease of the insulation resistance with the use of conventional ceramic powders, such as are used for the manufacture of ceramic foils. For example, with Nb, Co-doped ceramic layers of $BaTiO_3$ having a thickness of about 5 $\mu m$, resistivities of $10^8$ Ohm.m were measured. With a constant voltage U (for example 5 V), the decrease of the resistivity is even more strongly pronounced. Essentially the small number of grains between the electrodes leads to the small resistances of thin ceramic layers of $BaTiO_3$. It is known that the insulation resistance in ceramic material of $BaTiO_3$ is mainly determined by the very high-ohmic grain boundaries. If now the layer thickness is reduced, while the grain size remains unchanged, of course the number of grain boundaries between the electrodes decreases. This adversely affects the insulation resistance of the layer.

The life of the components, which is determined in the first instance by degradation induced by direct voltage, is also determined by the grain boundaries; the life decreases overproportionally with increasing field strength (by reduction of the layer thickness d with the same maximum nominal voltage U).

Attempts have been made to eliminate both the problem of the small insulation resistance and the problem of the reduced life of thin ceramic layers of $BaTiO_3$ by a reduction of the grain size in these layers.

It is known, for example, from J. Appl. Phys. 55 (1984), p. 3706 ff, to use cathode sputtering methods for depositing barium titanate layers. The cathode sputtering method has the disadvantage, however, that on the one hand it is technically very complicated, while on the other hand the envisaged deposition of multi-component layers having the desired stoichiometry is possible only with great difficulty. Moreover, reaction temperatures in the range of from 900° to 1200° C. are necessary to manufacture $BaTiO_3$ layers having high capacitances. These reaction temperatures are too high for the integration of a capacitor into a silicon single crystal wafer. According to the known method, 2.5 $\mu m$ thick $BaTiO_3$ layers were deposited on Pt substrates. For the layers treated at a temperature of 1200° C., a sheet capacitance of 25 $nF/mm^2$ and an insulation resistivity of $10^7$ Ohm.m were measured at 0.4 V/$\mu m$.

It is known from U.S. Pat. No. 3,002,861 to use chemical coating methods for manufacturing barium titanate layers, starting from barium and titanate alkoxide solutions. These starting materials have the disadvantage, however, that especially barium alkoxide is very sensitive to hydrolysis and that a reproducible deposition of barium titanate layers is difficult. A further disadvantage is that the layers thus formed are multi-phase layers and contain besides $BaTiO_3$ also $Ba_2TiO_4$ and $BaTiO_5$.

From Am. Cer. Soc. Vol. 55 (1976), p. 1064 ff. it is known, starting from barium naphthenate and titanium alkoxide solutions, to deposit 1-2 $\mu m$ thick barium titanate layers on substrates of glass or quartz glass for the use in IR spectral analyses. The layers thermally decomposed at a temperature in the range of from 200° to 800° C. exhibit for layers having layer thicknesses >1 $\mu m$ a grain size of 0.5 $\mu m$. With reference to the examinations which have led to the present invention, it can be ascertained that a grain size of 0.5 $\mu m$ is too large for a 1-2 $\mu m$ thick layer because in this case the number of grain boundaries per layer is too small; the values for the insulation resistance then become too low.

SUMMARY OF THE INVENTION

It is an object of the invention to provide a chemical coating method, by which mono-layer capacitors having dielectric layers on the basis of titanate can be manufactured in a simple manner and which have a comparatively high sheet capacitance, a low temperature dependence of their values for the dielectric constant and the dielectric loss factor and a comparatively high insulation resistance.

According to the invention, this object is achieved in that the ferroelectric layer is obtained in the form of a barium titanate layer having a layer thickness in the range of from 0.2 to 0.6 μm in that a stable solution of salts of carbonic acids, alkoxides and/or acetyl acetonates is applied and thermally decomposed at temperatures in the range of from 500° to 700° C., the solution constituting the ferroelectric layer being adjusted so that after the thermal decomposition process an excess quantity of titanium oxide of about 1 mol. % is obtained, and this coating process being repeated until the desired layer thickness is attained, after which the second noble metal electrode is provided on the ferroelectric layer.

It is now a surprise to find that by means of this chemical coating method ferroelectric layers can be manufactured which have an average crystallite size of only ≦0.1 μm when they are deposited on a substrate not exhibiting chemical boundary surface reactions with the material of the ferroelectric layer (this holds, for example, for noble metals, such as are used as capacitor electrodes) and when after the thermal decomposition process an excess quantity of titanium oxide of about 1 mol. % is present. Thus, by means of the method according to the invention, mono-layer capacitors can be manufactured which have on account of the comparatively small crystallite size of the ferroelectric layer sufficiently high values for the insulation resistance.

According to a further advantageous embodiment of the method in accordance with the invention, the solution is prepared with the use of at least one salt of a carbonic acid or at least one alkoxide or with the use of at least one salt of a carbonic acid and at least one alkoxide and/or at least one acetyl acetonate.

According to a further embodiment of the method in accordance with the invention, bivalent ions in the form of salts of carbonic acids and trivalent ions or ions of higher valencies in the form of alkoxides or acetyl acetonates are introduced into the solution.

According to an advantageous further embodiment of the method in accordance with the invention, the ferroelectric layer is formed on the first electrode in the form of a noble metal layer applied to the substrate or in the form of a polished noble metal disk as substrate.

According to a further advantageous embodiment of the method in accordance with the invention, as a substrate a multi-layer substrate is used in the form of a single crystal silicon wafer, on which an intermediate layer in the form of an oxide layer and on it a noble metal electrode layer as first electrode are deposited, an adhesion layer favouring the adhesion of the electrode metal being provided between the oxide layer and the electrode layer.

According to an advantageous further embodiment of the method in accordance with the invention, the solution forming the ferroelectric layer is applied to the first electrode by immersion or centrifuging. Thus, the advantage is obtained that the composition ratios given in the solution are maintained in the manufactured layer in a reproducible manner.

The invention has the advantage that particularly high values for the insulation resistance can be attained in a reproducible manner. Moreover, the excess quantity of titanium oxide has further the advantage that the formation of the phase $Ba_2TiO_4$ is avoided with certainty. Due to the absence of the moisture-sensitive phase $Ba_2TiO_4$, a high stability for a long time is obtained with respect to the insulation resistance.

The invention affords the further advantages that the comparatively low reaction temperatures for the thermal decomposition of the layers deposited from the solutions permit of integrating a capacitor into an integrated circuit on a silicon chip without the chip being adversely affected thermally. A further advantage of the dielectric layers manufactured by the method according to the invention is that on account of the comparatively small layer thicknesses of the dielectric layers capacitors having comparatively high capacitances (up to about 30 $nF/mm^2$) can be manufactured. Starting from reaction temperatures in the range of from 500° to 700° C., it is possible to deposit layers having a very small crystallite size, i.e. a crystallite size ≦0.1 μm. Due to the fine-grained structure of the layers, a smooth variation of the capacitance with the temperature can be attained in the dielectric layers and hence in the capacitors constructed therewith without it being necessary to introduce specific dopings. In the case of $BaTiO_3$ layers manufactured in accordance with the invention, the relative variation of the capacitance as a function of the temperature does not exceed 6% within a temperature range of from −50° to +125° C.

The layers having a comparatively fine-grained structure manufactured by means of the method according to the invention further have the advantage that in spite of the small layer thickness a plurality of grain boundaries is produced on account of the crystallites having a very fine-grained structure, as a result of which ferroelectric layers are obtained having a comparatively high insulation resistance.

DESCRIPTION OF THE PREFERRED EMBODIMENT

Embodiments of the invention will be described and their operation will be explained below.

A.

4.3790 g of titanium tetrabutylate and 14.14769 g of barium naphthenate (dissolved in white spirit; 12.38% by weight of Ba) are mixed in 42 ml of butanol. The homogeneous Ba-Ti solution is filtered through a cellulose acetate filter having a pore width of 0.2 μm.

By thermal oxidation, a thin $SiO_2$ layer is produced on Si single crystal (100) substrates. Subsequently, a 10 nm thick Ti layer and a 33 nm thick Pt layer are applied by means of cathode sputtering. For this purpose, platinum and titanium are first presputtered at an argon pressure of $6.7 \cdot 10^{-3}$ mbar for a duration of 30 min with a power of 300 W. The deposition of a 10 nm thick Ti layer and of a 33 nm thick Pt layer takes place at 300 W each time within 7 and 14 min, respectively. The substrate thus obtained are freed from dust particles with nitric acid, deionized water and then with isopropanol. The substrates are subsequently annealed for a duration of 6 h at a temperature of 700° C.

Each time 70 μl of the Ba-Ti solution described above are applied are applied to the substrates obtained by means of this method. The liquid is distributed over the substrates by centrifuging at 200 rev/min for a duration of 3 s; subsequently, the excess quantity is removed by centrifuging within 27 s at 1000 rev/min (table I, test No. 1), 2000 rev/min (table I, tests No. 2 and 4) and 2500 rev/min (table I, tests No. 3 and 5). Subsequently, the layers are heated in a tube furnace at a heating rate of 350 K/h to a temperature of 700° C. in a flow of oxygen, are annealed for a duration of 3 h at 700° C. and are then cooled to the ambient temperature by 350 K/h.

The coating process described here is repeated four times (tests No. 1, 2 and 3) and seven times (tests No. 4 and 5), respectively. The BaTiO$_3$ layers deposited by this method on Si single crystals have a layer thickness in the range of from 0.23 μm to 0.4 μm. The layers are crystalline under the conditions of deposition mentioned, layers having a very fine-grained structure being obtained on account of the low reaction temperatures. As can be derived from raster-microscopic pictures, the grain size is considerably smaller than 0.1 μm. On account of the BaTiO$_3$ crystallites having a very fine-grained structure, very wide X-ray diffraction reflexes are observed.

For the manufacture of thin BaTiO$_2$ capacitors, 100 gold electrodes having a surface area of 1 mm$^2$ are vapour-deposited on the BaTiO$_3$ layers. The dielectric values and the values for the insulation resistivity ρ for the tests No. 1 to 5 appear from Table II.

Measurements of the capacitance at the 100 capacitors with 0.5 V/1 kHz showed a sheet capacitance in the range of from 15.4 nF/mm$^2$ to 29.20 nF/mm$^2$. The dielectric losses lie in the range of from 3.8% to 6.7%. Measurements of the capacitance in dependence upon the temperature (−55° C. to +125° C.) show for the deposited layers on account of the fine-grained structure a very flat characteristic. At −55° C., ΔC/C (25° C.)= −6%; at 125° C., ΔC/C (25° C.)= −3%.

The insulation resistivity, measured at the ambient temperature, is $1.10^{10}$ to $2.10^{10}$ Ohm.m (test No. 1), $4.10^9$ to $5.10^9$ Ohm.m (tests No. 2 and 3), $1.10^{10}$ to $1.5.10^{10}$ Ohm.m (test No. 4) and $4.10^9$ to $5.10^9$ Ohm.m (test No. 5) in an electrical field of 1 V/μm. In a field of 5 V/μm the insulation resistivity is $4.10^9$ to $5.10^9$ Ohm.m (test No. 1), $4.10^8$ to $6.10^8$ Ohm.m (tests No. 2 and 3), $4.10^9$ to $5.10^9$ Ohm.m (test No. 4) and $2.10^9$ to $3.10^9$ Ohm.m (test No. 5). 70 μl of a Ba-Ti solution are applied to Si substrates (in accordance with embodiments under A). The solutions are distributed over the substrates by centrifuging at 200 rev/min for a duration of 3 s. The excess quantity of the liquid is then removed by centrifuging at 2000 rev/min (Table I, test No. 6) and at 2500 rev/min (Table I, test No. 7), respectively, within a duration of 27 s. Subsequently, the layers are heated at a heating rate of 350 K/h to a temperature of 700° C. in a flow of oxygen, are annealed at this temperature for a duration of 3 h and are cooled to the ambient temperature by 350 K/h. The coating process described here is repeated three times. During the coating process, the layers are annealed for a duration of 12 h at a temperature of 700° C. in a flow of oxygen.

For manufacturing thin BaTiO$_3$ capacitors, 100 gold electrodes having a surface area of 1 mm$^2$ are vapour-deposited on the BaTiO$_3$ layers. The dielectric values and the values for the insulation resistivity ρ for the tests No. 6 and 7 appear from Table II.

Measurements of the capacitance at the 100 capacitors with 0.5 V/1 kHz showed a sheet capacitance of 20.3 nF/mm$^2$ (test No. 6) and 24.6 nF/mm$^2$ (test No. 7). The dielectric losses are 4.5 to 5.4%.

The insulation resistivity ρ at the ambient temperature is $2.10^{10}$ to $2.5.10^{10}$ Ohm.m (test No. 6) and $1.10^{10}$ to $1.5.10^{10}$ Ohm.m (test No. 7) in an electrical field of 1 V/μm as well as $6.10^9$ to $1.5.10^9$ Ohm.m (test No. 6) and $4.10^9$ to $6.10^9$ Ohm.m (test No. 7) in a field of 5 V/μm.

C.

A polished Pt substrate is immersed for coating into a Ba-Ti solution (see embodiments under A) and is pulled out of the solution at a rate of 0.4 cm/s. The layer is heated in a furnace within a duration of 30 min to a temperature of 1200° C., is annealed at this temperature for a duration of 1 h and is cooled by 350 K/h to the ambient temperature. The coating process described here is repeated once. During the next twelve coatings, which are carried out in the manner described above, the layer is annealed for decomposition of the organic constituents and formation of oxides and volatile carbonates for a duration of 1 h at a temperature of 500° C. and is cooled by 250 K/h. For forming BaTiO$_3$, the layer is heated at a heating rate of 330 K/h to 1000° C. and is annealed at this temperature for a duration of 1 h. The cooling to the ambient temperature takes place at a rate of 330 K/h. The crystalline BaTiO$_3$ layer deposited according to this method on the Pt substrate is about 1 μm thick and has an average grain size of 0.1 μm (see Table I, test No. 8).

For manufacturing a thin BaTiO$_3$ capacitor, gold electrodes having a surface area of 9.4 mm$_2$ are vapour-deposited on the BaTiO$_3$ layer. The dielectric values and the values for the insulation resistivity ρ for test No. 8 appear from Table II.

Measurements of the capacitance at 1 V/1 kHz showed a sheet capacitance of 5.5 nF/mm$^2$ and dielectric losses of 3.6%. The insulation resistivity ρ at the ambient temperature is $1.10^{11}$ to $2.10^{11}$ Ohm.m in an electrical field of 1 V/μm and $5.10^{10}$ to $7.10^{10}$ Ohm.m in a field of 5 V/μm.

TABLE I

| Test No. | Number of Rev/ Rev. duration r.p.m./s | Annealing temperature/ Annealing duration (°C./h) | Number of coatings | Layer thickness (μm) |
| --- | --- | --- | --- | --- |
| 1 | 200/3 + 1000/27 | 700/3 | 5 | 0.4 |
| 2 | 200/3 + 2000/27 | 700/3 | 5 | 0.26 |
| 3 | 200/3 + 2500/27 | 700/3 | 5 | 0.23 |
| 4 | 200/3 + 2000/27 | 700/3 | 8 | 0.39 |
| 5 | 200/3 + 2500/27 | 700/3 | 8 | 0.35 |
| 6 | 200/3 + 2000/27 | 700/3 | 4)$_5$ | |
|   | 200/3 + 2000/27 | 700/12 | 1) | 0.3 |
| 7 | 200/3 + 2500/27 | 700/3 | 4)$_5$ | |
|   | 200/3 + 2500/27 | 700/12 | 1) | 0.26 |
| 8 | immersed | 1200/1 | 14 | 1.0 |

TABLE II

| Test No. | C (nF/mm$^2$) | tg δ (%) | ρ 1 V/μm (Ohm.m) | ρ 5 V/μm (Ohm.m) |
| --- | --- | --- | --- | --- |
| 1 | 16.1 | 4.6 | $1.10^{10}$–$2.10^{10}$ | $4.10^9$–$5.10^9$ |
| 2 | 29.2 | 6.7 | $4.10^9$–$5.10^9$ | $4.10^8$–$6.10^8$ |
| 3 | 27.8 | 5.8 | $4.10^9$–$5.10^9$ | $4.10^8$–$6.10^8$ |
| 4 | 15.4 | 3.8 | $1.10^{10}$–$1.5.10^{10}$ | $4.10^9$–$5.10^9$ |
| 5 | 19.3 | 4.8 | $4.10^9$–$5.10^9$ | $2.10^9$–$3.10^9$ |
| 6 | 20.3 | 4.5 | $2.10^{10}$–$2.5.10^{10}$ | $6.10^9$–$1.5.10^9$ |
| 7 | 24.6 | 5.4 | $1.10^{10}$–$1.5.10^{10}$ | $4.10^9$–$6.10^9$ |
| 8 | 5.5 | 3.6 | $1.10^{11}$–$2.10^{11}$ | $5.10^{10}$–$7.10^{10}$ |

C = sheet capacitance at 25° C.
tg δ = diel. loss factor
ρ = insulation resistivity at 25° C.

We claim:

1. A method of making a mono-layer capacitor having a fine-grained barium-titanate ferroelectric dielectric layer by providing said layer on a first noble metal electrode, which is supported on a substrate, and then providing a second noble metal electrode on the layer, said layer being provided on the first noble metal electrode by:
  a. mixing a stable solution of barium and titanium salts of at least one compound selected from the group consisting of carbonic acids, alkoxides, acetyl acetonates, and mixtures thereof, and adjusting the solution such that, when a layer is formed by performing the following steps b and c, an excess quantity of titanium oxide of about 1 mol. % is obtained;
  b. applying a coating of the solution;
  c. thermally decomposing the coating at a temperature in the range of about 500° to 700° C.; and
  d. repeating steps b and c until a desired layer thickness is obtained.

2. A method as claimed in claim 1, characterized in that the solution is prepared with the use of at least one salt of a carbonic acid and of at least one alkoxide or with the use of at least one salt of a carbonic acid and of at least one alkoxide and/or at least one acetyl acetonate.

3. A method as claimed in claims 1 or 2, characterized in that bivalent ions in the form of salts of carbonic acids and trivalent ions and/or ions of higher valencies in the form of alkoxides or acetyl acetonates are introduced into the solution.

4. A method as claimed in at least one of claims 1 or 2, characterized in that the ferroelectric layer is formed on the first electrode in the form of a noble metal layer provided on a substrate or in the form of a polished noble metal disk as substrate.

5. A method as claimed in claim 4, characterized in that as substrate a multilayer substrate is used in the form of a monocrystalline silicon wafer, on which an intermediate layer in the form of an oxide layer and on it a noble metal electrode layer as first electrode are deposited, an adhesion layer favouring the adhesion of the electrode metal being provided between the oxide layer and the electrode layer.

6. A method as claimed in claim 5, characterized in that the oxide layer is formed on the monocrystalline silicon substrate by thermal oxidation.

7. A method as claimed in claims 1 or 2, characterized in that as electrode metal for the first electrode platinum is used.

8. A method as claimed in claim 7, characterized in that a titanium layer is provided as adhesion layer for the electrode layer.

9. A method as claimed in at least one of claims 1 or 2, characterized in that the solution forming the ferroelectric layer is applied to the first electrode by immersion or centrifuging.

10. A method as claimed in at least one of claims 1 or 2, characterized in that for the solution forming the ferroelectric layer titanium tetrabutylate and barium naphthenate are used.

11. A method as claimed in at least one of claims 1 or 2, characterized in that the second electrode is formed by a gold layer.

* * * * *